United States Patent [19]

Hardegen et al.

[11] Patent Number: 4,909,701

[45] Date of Patent: * Mar. 20, 1990

[54] ARTICULATED ARM TRANSFER DEVICE

[75] Inventors: E. Brian Hardegen, Westford, Mass.; Todd E. Bottomley, Swamzey, N.H.; James C. Davis, Jr., Carlisle, Mass.

[73] Assignee: Brooks Automation Inc., North Billerica, Mass.

[*] Notice: The portion of the term of this patent subsequent to May 19, 2004 has been disclaimed.

[21] Appl. No.: 50,520

[22] Filed: May 18, 1987

Related U.S. Application Data

[63] Continuation-in-part of Ser. No. 755,905, Jul. 17, 1985, Pat. No. 4,666,366, which is a continuation of Ser. No. 466,091, Feb. 14, 1983, abandoned, and a continuation-in-part of Ser. No. 695,899, Jan. 29, 1985, Pat. No. 4,730,976, which is a continuation-in-part of Ser. No. 466,091, Feb. 14, 1983, abandoned, which is a continuation-in-part of Ser. No. 661,356, Oct. 16, 1989, abandoned.

[51] Int. Cl.⁴ ............................................. B65G 65/00
[52] U.S. Cl. ..................................... 414/749; 901/17; 901/25; 414/744.6
[58] Field of Search ............... 414/749, 744 R, 744 B, 414/744 C, 744 A, 738, 733, 732, 590, 222; 901/17, 22, 23, 25, 50

[56] References Cited

U.S. PATENT DOCUMENTS

| 3,874,525 | 4/1975 | Hassan et al. | 414/225 |
|---|---|---|---|
| 4,208,159 | 6/1980 | Uehara et al. | 414/225 |
| 4,218,173 | 8/1980 | Coindet et al. | 414/732 X |
| 4,295,780 | 10/1981 | Wada et al. | 414/749 |
| 4,507,044 | 3/1985 | Hutchins et al. | 414/744 A |

FOREIGN PATENT DOCUMENTS

| 104357 | 10/1974 | Japan . | |
|---|---|---|---|
| 51-12838 | 4/1976 | Japan . | |
| 52-44985 | 8/1977 | Japan | 414/744 B |
| 159534 | 10/1982 | Japan . | |

OTHER PUBLICATIONS

*Nikkei Mechanical*, p. 37, Sep. 13, 1982.

Primary Examiner—Robert J. Spar
Assistant Examiner—Donald W. Underwood
Attorney, Agent, or Firm—Henry C. Nields

[57] ABSTRACT

In a material transfer device, an articulated arm assembly extends and retracts in a "froglike" motion to transfer an object between a plurality of locations. The articulated arm assembly is rotatable about a pivot point in a radial plane and can be raised or lowered in an axial direction to align the object with the intended destination. A greater degree of axial mobility may be provided, for example by a rotating lift screw. A vacuum chamber may be provided, with the arm assembly moving the object between locations in the chamber.

14 Claims, 6 Drawing Sheets

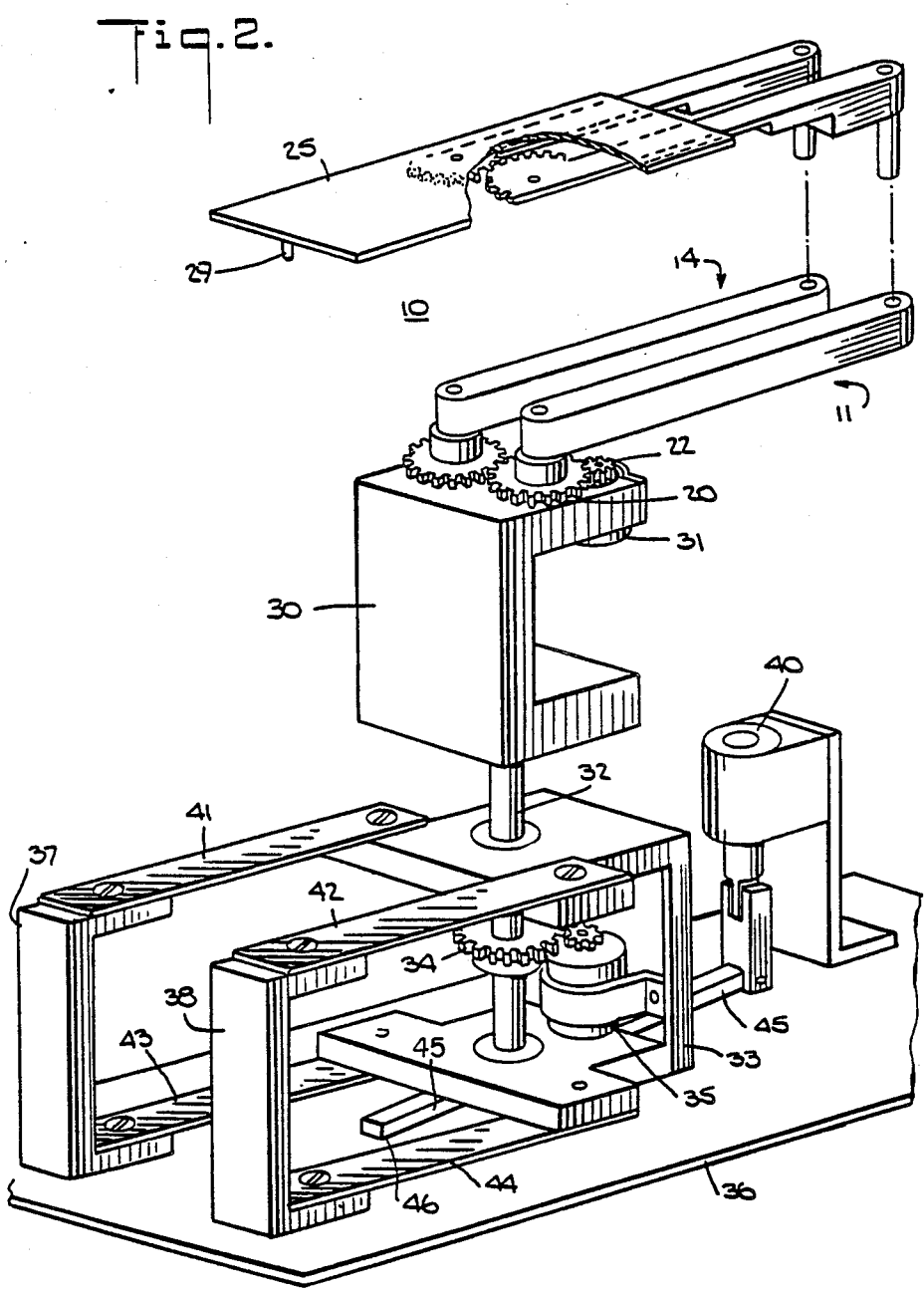

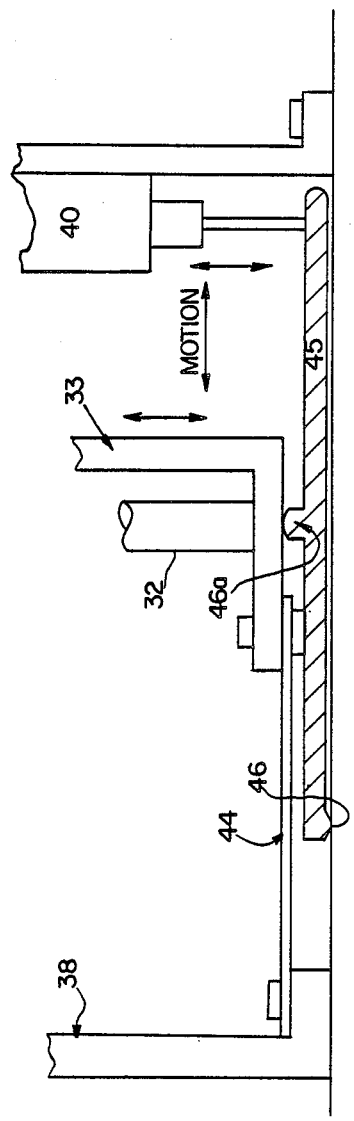

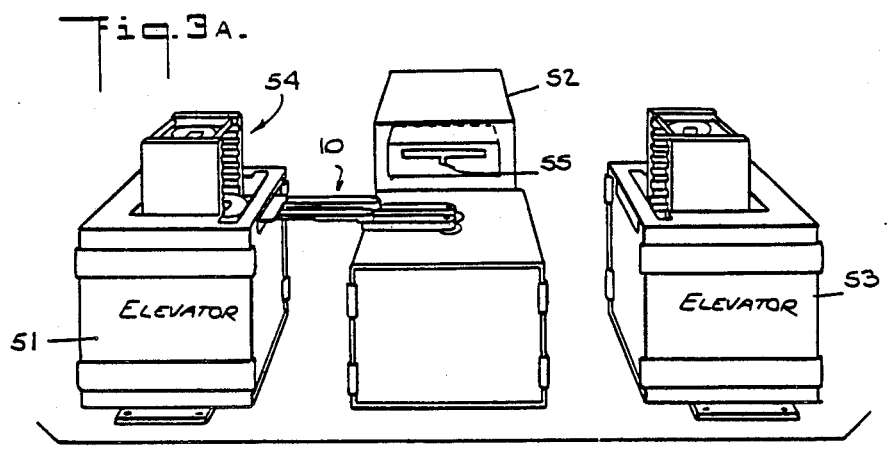
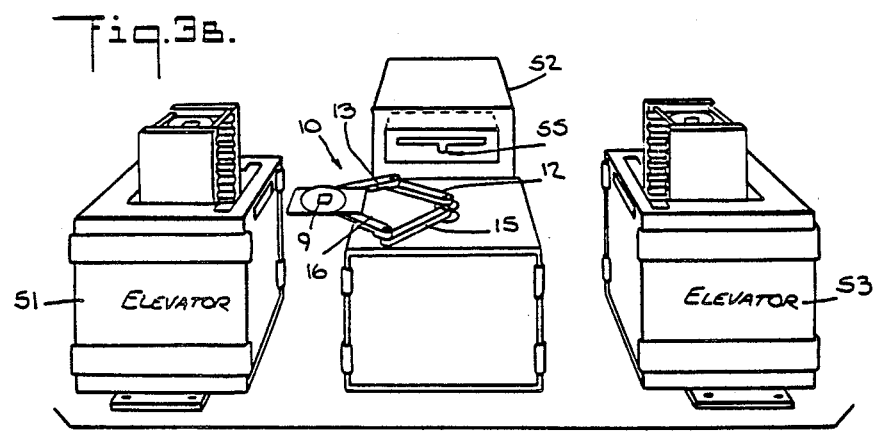
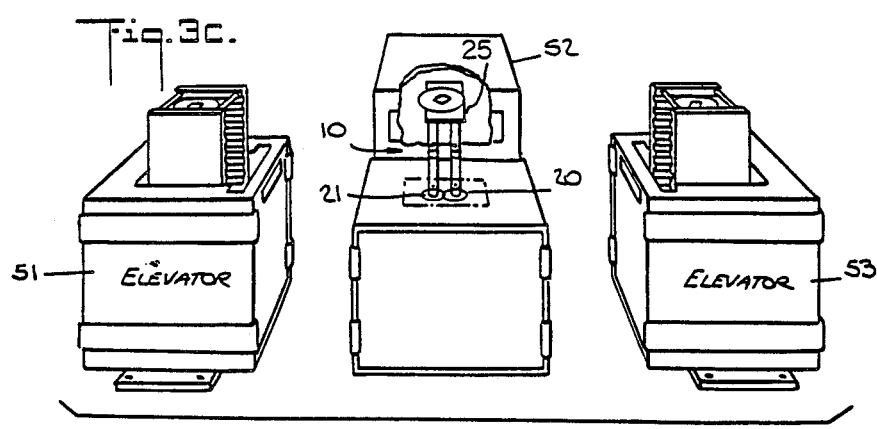

ARTICULATED ARM TRANSFER DEVICE

CROSS REFERENCE TO RELATED APPLICATIONS

This is a continuation-in-part of copending U.S. patent application Ser. No. 755,905, filed July 17, 1985, now U.S. Pat. No. 4,666,366, which is a continuation of U.S. patent application Ser. No. 466,091, filed Feb. 14, 1983, now abandoned. This application is also a continuation-in-part of copending U.S. patent application Ser. No. 695,899, filed Jan. 29, 1985, now U.S. Pat. No. 4,730,976, which is in turn a continuation-in-part of U.S. patent applications Ser. No. 466,091 filed Feb. 14, 1983, and now abandoned and Ser. No. 661,356, filed Oct. 16, 1984 and now abandoned. These applications are all assigned to the assignee of the present invention.

BACKGROUND OF THE INVENTION

1. Field of the Invention

The apparatus of the present invention relates generally to material transfer devices, and more specifically to an apparatus for transferring silicon wafers to and from a plurality of work stations.

2. Description of the Prior Art

The transfer of delicate silicon wafers or the like between a plurality of work stations or locations in the manufacture of semiconductor devices presents unique handling problems. The silicon wafers are very delicate and have highly polished surfaces. When the wafers are abruptly moved, they tend to slide. This sliding action can cause the silicon wafers to abrade or alternatively can cause damage to their edges if they collide.

There are numerous devices described in the prior art for transferring silicon wafers. For example:

- U.S. Pat. No. 3,823,836 discloses an apparatus which includes a supply carrier with a plurality of ledges to hold the silicon wafers and a withdrawal device having a vacuum chuck. The vacuum chuck is attached to an elevator which raises and lowers the chuck. A horizontal transfer arm coupled to the vacuum chuck is used to transfer the silicon wafer from the supply carrier to a desired work station.
- U.S. Pat. No. 3,370,595 discloses a wafer transfer handling apparatus having an indexable carrier for transferring wafers to and from work stations. Wafers enter and leave the wafer carrier on an air slide with the aid of a wafer ejector acceptor arm having directional air jets. The wafer ejector acceptor arm controls the driving of the wafers into or out of the carrier from or onto the air slide, which moves the wafers to or from a work station.
- U.S. Pat. Nos. 4,062,463, 3,874,525 and 4,028,159 also disclose wafer transfer devices which include either pneumatic components or gripping devices for handling the wafers.

The above described devices of the prior art utilize relatively complex and costly pneumatic components or utilize undesirable gripping devices which may do damage to the delicate wafers. Moreover, the above described devices tend to be limited to the transfer of silicon wafers between fixed locations which are difficult to change.

Accordingly, there is a need for a simple and reliable transfer device that will not damage the object and that is capable of transferring objects between a plurality of locations disposed in various axial and radial planes.

SUMMARY OF THE INVENTION

The present invention provides a simple and reliable device for transferring objects, such as silicon wafers, camera lenses, crystal oscillators, or the like, between a plurality of locations disposed in various axial and radial planes. This apparatus includes a support, first and second articulated arms, a platform or other suitable holder coupled to the articulated arms, and a motor to drive one of the articulated arms. The two articulated arms are operatively coupled such that when one arm is driven by the motor the articulated arms extend and retract in a "froglike" or "frogkick" type of motion. The platform having the object disposed thereon is displaced in a harmonic motion as the articulated arms extend and retract thereby minimizing the tendency of the object to slide. The articulated arm assembly is preferably coupled to a base via a rotation motor such that the entire articulated arm assembly may be rotated in a radial plane. The articulated arm assembly is also, in one embodiment, preferably coupled to the base via a plurality of flexures or levers that are responsive to a force such that the platform assembly may be displaced in an axial direction. In another embodiment, the arm assembly is mounted, by means other than flexures, for axial movement through a much larger range than that attainable with flexures. The assembly is adaptable for use in a variety of environments, including operation in a vacuum chamber or other controlled environment. The assembly may be mounted for movement inside a vacuum chamber between the assembly and its support.

BRIEF DESCRIPTION OF THE DRAWINGS

FIG. 2 is an exploded isometric view of the apparatus forming an embodiment of the present invention;

FIG. 2A is a side view of the embodiment shown in FIG. 2;

FIGS. 3A, 3B, and 3C are illustrations of the operation of the apparatus of FIG. 2;

DESCRIPTION OF THE PREFERRED EMBODIMENTS

Figure 1:
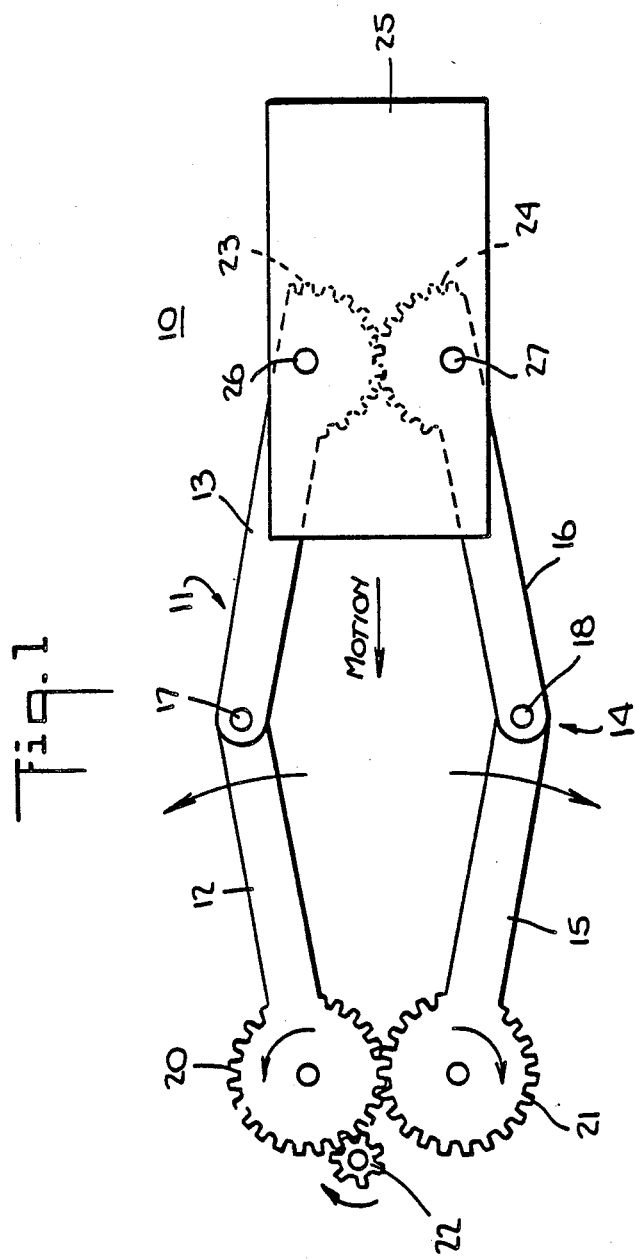
FIG. 1 is a plan view of an articulated arm assembly used in the present invention.

Referring now to FIG. 1, a plan view of an articulated arm assembly 10 used in the present invention is provided. The articulated arm assembly 10 includes a first articulated arm 11 and a second articulated arm 14. The articulated arm 11 is comprised of two segments, a drive segment 12 and a driven segment 13, which are joined by a pinned connection 17. Likewise the articulated arm 14 is comprised of two segments, a drive segment 15 and a driven segment 16, which are joined by a pinned connection 18. In one embodiment the drive segments 12, 15 are of lesser length than the driven segments 13, 16.

The drive segments 12, 15 include generally circular gears 20, 21, respectively. The gears 20, 21 may be integrally formed as part of the drive segments 12, 15 or they may be individually formed and affixed to the drive segments by any suitable fastening method. The gear 20 is operatively coupled to a drive pinion 22. The gear 20 is driven by the drive pinion 22 and in turn gear 20 drives gear 21.

The driven segments 13, 16 include semicircular anti-rotation gears 23, 24, respectively. A platform 25 or other suitable holder for carrying the object is coupled to the anti-rotation gears 23, 24 by bearings 26, 27. The anti-rotation gears 23, 24 may be replaced by frictional surfaces or cable and sheave assemblies to prevent the rotation of the ends of driven segments 13, 16.

It can be appreciated that as the drive pinion 22 rotates in a clockwise direction, gear 20 and drive segment 12 rotate in a counterclockwise direction, and gear 21 and drive segment 15 rotate in a clockwise direction. Consequently, the articulated arms 11, 14 retract in a "froglike" motion and displace the platform 25 in a harmonic motion toward the drive gears 20, 21. The anti-rotation gears 23, 24 prevent slewing of the platform 25, thereby providing a straight line motion of the object being transported.

The harmonic motion of the platform 25 is an important feature of the present invention. When the articulated arms 11, 14 are in their fully extended position the arms 11, 14 are substantially parallel. When the platform 25 is retracted from the fully extended position, the platform accelerates relatively slowly from zero velocity until it reaches the midpoint of the fully extended articulated arms, where it reaches its maximum velocity. After the platform 25 reaches the midpoint, it begins to decelerate until it reaches its resting point over the gears 20, 21.

An object, such as a silicon wafer, disposed on the platform 25 may have highly polished surfaces and may be held on the platform by friction alone. Any abrupt acceleration of the platform, therefore, would cause the wafer to slide. The gentle acceleration and deceleration of the harmonic motion described above, however, minimize the tendency of the object to slide, thereby preventing abrasion of the object and preventing it from colliding with other objects. Where applicable, suction or clamps may be used for additional safety.

It can be appreciated that if the platform 25 is resting over the gears 20, 21 and that if the drive pinion 22 is rotated in a counterclockwise direction, then the articulated arms 11, 14 and the platform 25 will be extended in a "froglike" motion. The platform 25 will move in a harmonic motion until the articulated arms 11, 14 are fully extended.

Referring now to FIG. 2, an exploded isometric view of one embodiment of the invention is provided. The platform 25 of the articulated arm assembly 10 may include a pin 29 which cooperates with a notch to form a detent mechanism as hereinafter described. The articulated arm assembly 10 is shown as being disposed on a C-shaped support 30. An electric motor 31 is mounted on the support 30 and coupled to the drive pinion 22. The drive pinion engages gear 20 which drives gear 21 causing the articulated arm, 11, 14 to extend and retract as described above. The support 30 is coupled to a shaft 32 which is journalled in a second C-shaped support 33. The shaft 32 includes a rotation gear 34 which is coupled to an electric motor 35 which rotates the entire articulated arm assembly 10. When the platform 25 is centered above the shaft 32, any centrifugal forces on the silicon wafer being transported are eliminated.

The support 33 is coupled to a base 36 via C-shaped supports 37, 38 and flexures 41–44. A lift solenoid 40 is disposed on the base 36 and is coupled to a lever 45. The lever 45 is disposed beneath the shaft 32. One end of the lever 45 serves as a first fulcrum 46 disposed on the base 36, and a second fulcrum (see FIG. 2A) is disposed at the bottom of shaft 32. When the solenoid 40 is activated, the shaft 32 is displaced upwards in an axial direction, thereby causing the flexures 41–44 to deflect. It can be appreciated that as the shaft 32 is displaced axially the entire articulated arm assembly 10 is also axially displaced.

Referring now to FIGS. 3A, 3B, and 3C, illustrations of the operation of the present embodiment are provided. The articulated arm assembly 10 is disposed between a first elevator 51, an oven 52, and a second elevator 53. A plurality of silicon wafers may be stacked in the horizontal slots of rack 54 of the elevator 51.

In FIG. 3A the articulated arm assembly 10 is illustrated as being in its extended position with the platform 25 disposed within a horizontal slot of rack 54. The elevator 51 may include a notch (not shown) which cooperates with the vertical pin 29 of platform 25 to form a detent mechanism for holding the platform 25 securely in place. Once aligned with the horizontal slot of rack 54, the platform may be raised by the lifting solenoid 40 as described above. The platform 25 is raised typically 50 to 100 milliinches in order to place a silicon wafer on the platform 25.

In FIG. 3B the drive segments 12, 15 are illustrated as being rotated in opposite directions, thereby causing the articulated arm assembly 10 to retract in a "froglike" motion. As the articulated arm assembly 10 retracts, the platform 25 is withdrawn from the vicinity of elevator 51 with a silicon wafer 9 disposed thereon.

In FIG. 3C, the entire articulated arm assembly has been rotated 90° to align the platform 25 with the opening of the oven 52. It should be noted that the articulated arm assembly 10 can be rotated through any angle desired to align it with a desired work station. The drive gears 20, 21 are then rotated in opposite directions causing the articulated arm assemble 10 to extend in a "froglike" motion until the platform 25 and the silicon wafer 9 are disposed within the oven 52. The platform 25 and silicon wafer 9 may be withdrawn from the oven 52 in a fashion similar to that described above in order to place the silicon wafer 9 in the elevator 53. The oven 52 also may include a notch 55 which cooperates with the pin 29 of platform 25 to act as a detent mechanism.

It should be noted that the motor 31, the motor 35 and the lift solenoid 40, may be controlled by electronic logic circuits (not shown) to provide precise control of the articulated arm assembly 10. If the control is precise enough the detent mechanism comprised of the pin 29 and the notch 55 may not be necessary.

Referring again to FIG. 1, it should be noted that if the drive segments 12, 15 are of equal length to the driven segments 13, 16 the operation of the articulated arms 11, 14 will be affected significantly. Instead of the platform 25 coming to rest over the drive gears 20, 21 as described above, the platform 25 will extend past the drive gears if the drive segments 12, 15 and the driven segments 13, 16 are of equal length.

For example, if in FIG. 3B the drive segments 12, 15 and the driven segments 13, 16 are of equal length, the platform 25 may be retracted from the elevator 51 and extended to the elevator 53 without any rotation of the articulated arm assembly 10. If the drive segments 12, 15 are of lesser length than the driven segments 13, 16, the platform 25 will come to rest over the drive gears 20, 21 when it is retracted from the elevator 51 as described above. The entire articulated arm assembly 10 then must be rotated 180° to align the platform 25 with elevator 53, before the articulated arm assembly can be extended.

Figure 4:
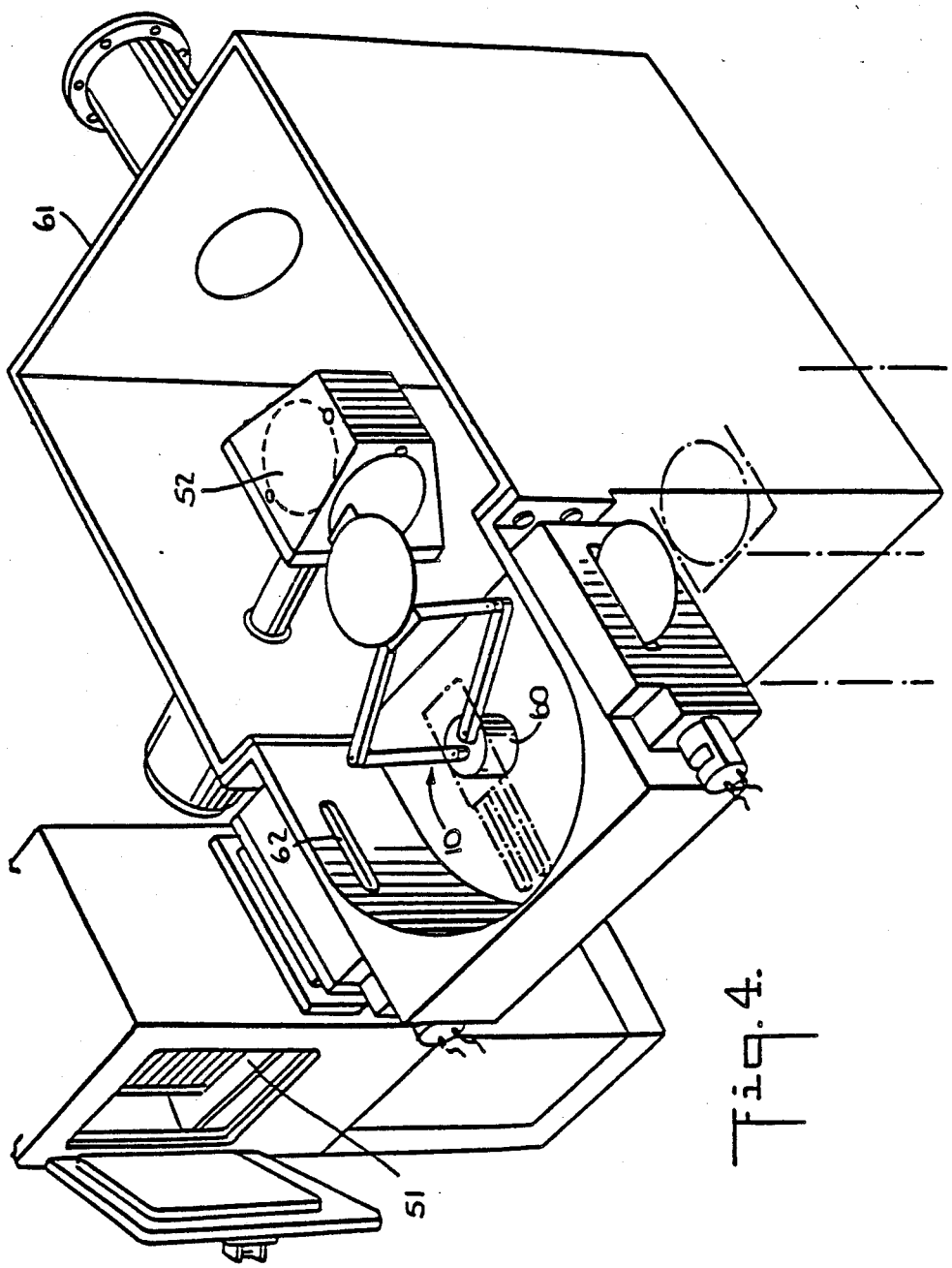
FIG. 4 is a cutaway view of another embodiment of the invention, incorporating a vacuum chamber.

The embodiment of FIG. 4 is similar to that previously described except that in this embodiment the articulated arm assembly 10 and the chamber 25 are mounted for movement within a vacuum chamber 61. Also, as shown, the oven 52 may be positioned inside the vacuum chamber 61 and a window 62 may be provided to permit access by the platform 25 to the first elevator 51. A similar window may be provided for access to the elevator 53. A seal 60 is provided extending into the vacuum chamber 61 just below the articulated arm assembly 10 and the above described supporting and articulating mechanisms for lifting, extending, retracting and rotating the platform 25 are arranged inside the vacuum chamber. As can be seen, this arrangement permits wafers to be transferred to and from a processing station entirely within a vacuum chamber isolated environment.

Figure 5:
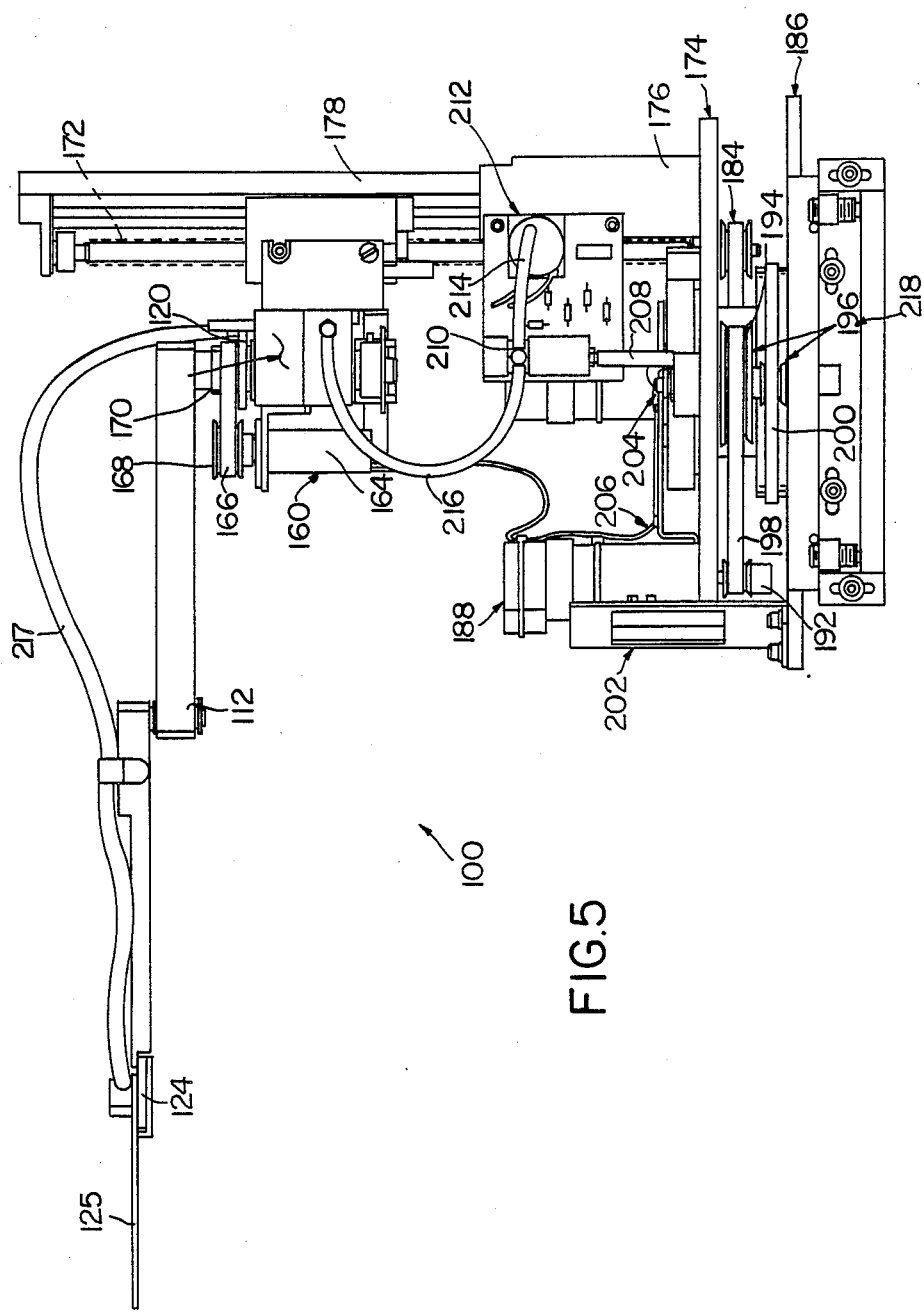
FIG. 5 is a side elevation view of a third embodiment of the invention, which has the ability to move over a considerable range in an axial direction.
Figure 6:
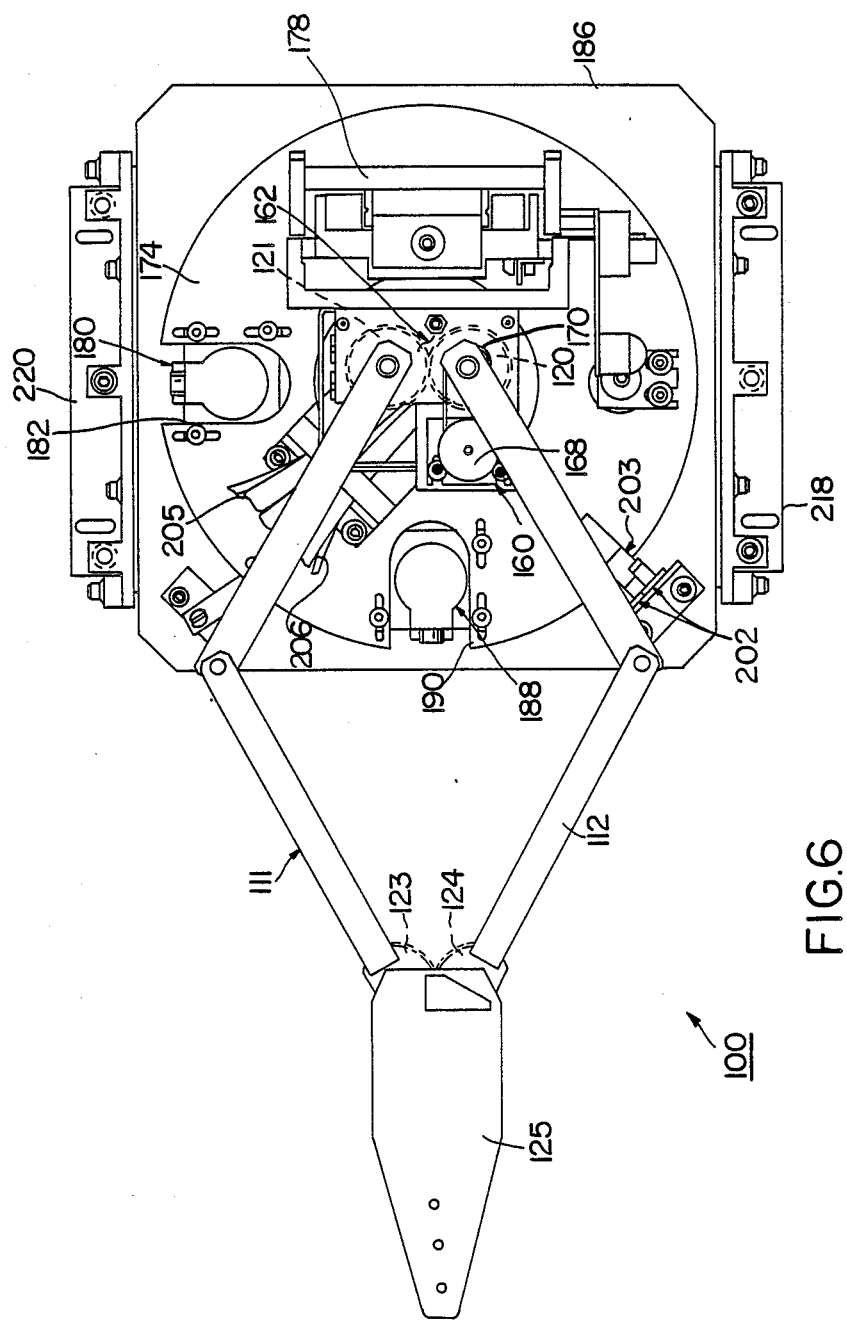
FIG. 6 is a plan view of the embodiment of FIG. 5.

FIGS. 5 and 6 show another embodiment of the present invention, in which the transfer device of the invention is able, not only to provide a degree of axial mobility to align the pan with a target destination, as in the embodiments discussed above, but to provide axial mobility similar to magnitude to the range of radial movement of the pan itself. In this embodiment, the parts of the arm assembly 10 are largely the same as those described above in connection with other embodiments, and therefore, insofar as they are the same, they will not be individually described again.

In this embodiment, as in those described above, a pair of articulated arms 111, 112 supporting a platform 125 and having anti-rotation gears 123, 124 at their distal end, and provided with drive gears 120, 121 at their proximal end, are mounted, together with their drive mechanism 160, as an arm assembly unit 162 arranged for movement in the axial direction (in the embodiment shown in FIG. 5, this is the vertical direction). More specifically, the gears 120, 121 are driven by an arm extend/retract motor 164 via a belt 166 and pulleys 168, 170, although the motor 164 could be arranged to transmit force to the drive gear 120 or 121 via a drive pinion, as in the embodiment of FIG. 1. In the construction shown, the drive mechanism housing supports the arm assembly above it. The arm assembly unit 162 is mounted for vertical movement along a shaft 172, the lower end of which is supported rotatably by an upper base or mounting plate 174. The mounting plate 174 directly supports, using mounting 176, the vertical bracket 178 which actually receives the lower end of the shaft 172.

In the preferred embodiment shown in FIGS. 5 and 6, the vertical shaft 172 is a lift lead screw, and the arm assembly unit 162 mounted on it is internally threaded to cooperate with the thread of the screw, so that rotation of the latter raises or lowers the former. The screw itself has its lower end supported on the vertical bracket 178, as noted, and has its upper end also supported in vertical bracket 178, which extends parallel to the screw shaft 172. The arm assembly unit 162 preferably has a V-groove or the like formed in it to cooperate with a portion of the bracket 178 so that the latter acts as a guide for the vertical movement of the arm assembly unit 162, preventing rotation of the unit 162 as the latter is moved up and down the lift lead screw 172. Preferably, ball bearings or other bearings are provided in the groove to reduce friction and facilitate movement of the unit 162.

Power for raising and lowering the arm assembly unit 162 is provided by a lift motor 180 (see FIG. 6), which is mounted in a recess 182 provicded at one edge of the rotating base or mounting plate 174. This motor 180 drives the lift lead screw 172 for rotation, by means of a belt and pulley arrangement 184 (only one pulley of this arrangement is shown in the figures) provided beneath the mounting plate 174.

The upper base or mounting plate 174 is mounted on a second base 186 for rotation about its own central axis. Power for such rotation is provided by a rotate drive motor 188 mounted in a second recess 190 in the upper base 174, and is transmitted via pulleys 192, 194, 196 and belts 198, 200 disposed between the mounting plate 174 and the stationary lower base 186, and arranged to function as a conventional speed reducer.

The stationary base 186 also supports rotate position sensors 202 disposed at one corner of the base 186 for detecting the rotational position of the rotating mounting plate 174. The rotate position sensors 202 are preferably photointerrupters which detect a pin or flag (not shown) provided for that purpose on the upper base 176. Detection of the flag by the sensors 202 means that the upper base 176 has rotated to the limit of its 360+ range of movement; the sensors 202 thus do not serve to monitor the precise, instantaneous rotational position of the upper base 76, although if desired, to provide such sensors would be well within the ordinary level of skill. Similar flags and photointerrupters are provided to permit detection of the arm assembly unit 162 at its home position along its range of vertical movement, as well as detection of the articulated arms 111, 112 being at their home position in their extension-retraction movement.

The operation of the motors 164, 180, 188 is preferably controlled electronically, and wires for this purpose pass through a feed-through 204 near the center of the rotating mounting plate 174, from which one set of wiring 205 proceeds to the lift motor 180, and another set 206 to the rotate drive motor 188, and from there to the arm extend/retract motor 164. Preferably, each of the motors 164, 180, 188 is provided with a suitable encoder to monitor its instantaneous position, for use in controlling the motors more precisely.

In this embodiment, vacuum suction is provided to be applied to an object on the platform 125, for two purposes. First, the suction holds the article on the platform. Second, monitoring the suction strength provides an indication of the presence or absence of an object on the platform. To supply the suction, a vacuum line 208 is provided, and may also pass through the same feed-through 204 as does the wiring. Such an arrangement is shown in FIG. 5, where the vacuum line 208, which extends through feedthrough 204, is connected to a vacuum control board 212 which is supported on the mounting 176. The vacuum control board 212 monitors the vacuum line pressure using a suitable known device 214; the vacuum line 216 is routed from the vacuum control board which extends up to the arm extend-retract motor housing, from which another vacuum line, indicated by 217, passes out along the arms 111, 112 to the platform 125.

In the embodiment shown in FIGS. 5 and 6, the stationary base 186 is supported on leveling feet 218, 220 which permit the exact orientation of the base 186 to be adjusted so that the latter is perfectly level. These feet 218, 220 may have any suitable form, their precise design being well within the ordinary level of skill.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. An apparatus for transferring objects, comprising:
   a support;
   first and second articulated arms supported on said support;
   said first articulated arm having a drive segment disposed for rotation about a first axis and a driven segment;
   said second articulated arm having a drive segment disposed for rotation about a second axis and a driven segment, said drive segment being coupled to and driven by rotation of said drive segment of said first articulated arm;
   holding means pivotally coupled to said driven segments of said first and second articulated arms, said driven segments being engaged so as to prevent rotation of said holding means;
   means capable of driving said drive segment of said first articuated arm for rotation through an angle in the range of from greater than 120° up to and including 180° at a contant rotational speed to move said holding means between an extended position and a retracted position such that said holding means moves with harmonic motion; and
   means for moving said support in a direction substantially parallel to said first axis.

2. An apparatus according to claim 1, wherein said drive segments are lesser in length than said driven segments.

3. An apparatus according to claim 1, wherein said drive segments and said driven segments are of equal length.

4. An apparatus according to claim 1, wherein said support is coupled to a base via shaft with a rotation gear and a first motor.

5. An apparatus according to claim 4, wherein said drive and driven segments are joined by a pinned connection.

6. An apparatus according to claim 5, wherein said gear means coupled to said drive segments of said first and second articulated arms include circular gears disposed at one end of said drive segments and said circular gear coupled to said first articulated arm being responsive to said drive means.

7. An apparatus according to claim 6, wherein said anti-rotation means comprise anti-rotation gears disposed at one end of said driven segments.

8. An apparatus according to claim 7, wherein said holding means includes a platform which is coupled to said anti-rotation gears by bearings.

9. An apparatus according to claim 8, wherein said axial displacement means includes a plurality of flexures and a solenoid, wherein said solenoid is for applying a force to move sid support vertically and said flexures are so arranged relative to said base and said solenoid as to flex when said support moves vertically.

10. An apparatus according to claim 1, further comprising a first base upon which said support is supported, and a second base, upon which said first base is supported for rotation relative to said second base, and further comprising means for rotating said first base relative to said second base; and wherein said axial-motion means comprises a second driving means, supported on said first base.

11. An apparatus according to claim 10, wherein said axial-motion means comprises a lift lead screw rotatable about its own axis, said support threadedly engaging said screw.

12. An apparatus according to claim 10, wherein said axial-motion means is arranged to guide said support while moving said support in said direction.

13. An apparatus according to claim 1, further comprising vacuum suction means for applying vacuum suction to an object supported by said holding means for use in the presence of an ambient atmosphere.

14. An apparatus for transferring objects, comprising:
   a support;
   first and second articulated arms supported on said support;
   said first articulated arm having a drive segment disposed for rotation about a first axis and a driven segment;
   said second articulated arm having a drive segment disposed for rotation about a second axis and a driven segment, said drive segment being coupled to and driven by rotation of said drive segment of said first articulated arm;
   holding means pivotally coupled to said driven segments of said first and second articulated arms, said driven segments being engaged so as to prevent rotation of said holding means;
   means capable of driving said drive segment of said first articulated arm for rotation through an angle in the range of from greater than 90° up to and including 180° at a constant rotational speed to move said holding means between an extended position and a retracted position such that said holding means moves with harmonic motion; and
   axial displacement means for raising and lowering said support in a direction substantially parallel to said first axis;
   wherein said support is coupled to a base via a shaft with a rotation gear and a first motor;
   wherein said drive and driven segments are joined by a pinned connection;
   wherein gear means coupled to said drive segments of said first and second articulated arms include circular gears disposed at one end of said drive segments and said circular gear coupled to said first articulated arm being responsive to said driving means;
   wherein anti-rotation means comprise anti-rotation gears disposed at one end of said driven segments;
   wherein said holding means includes a platform which is coupled to said anti-rotation gears by bearings; and
   wherein said axial displacement means includes a plurality of flexures and a solenoid, wherein said solenoid is for applying a force to move said support vertically and said flexures are so arranged relative to said base and said solenoid as to flex when said support moves vertically.

* * * * *